United States Patent
Qian et al.

(10) Patent No.: US 8,650,739 B2
(45) Date of Patent: Feb. 18, 2014

(54) METHOD FOR MANUFACTURING TRANSMISSION ELECTRON MICROSCOPE MICRO-GRID

(75) Inventors: Li Qian, Beijing (CN); Li Fan, Beijing (CN); Liang Liu, Beijing (CN); Chen Feng, Beijing (CN); Yu-Quan Wang, Beijing (CN)

(73) Assignee: Beijing FUNATE Innovation Technology Co., Ltd., Beijing (CN)

( * ) Notice: Subject to any disclaimer, the term of this patent is extended or adjusted under 35 U.S.C. 154(b) by 532 days.

(21) Appl. No.: 12/944,191

(22) Filed: Nov. 11, 2010

(65) Prior Publication Data

US 2011/0252619 A1    Oct. 20, 2011

(30) Foreign Application Priority Data

Apr. 14, 2010    (CN) .......................... 2010 1 0146837

(51) Int. Cl.
*B21D 39/00*    (2006.01)
(52) U.S. Cl.
USPC .............. 29/458; 250/311; 977/861; 977/880
(58) Field of Classification Search
USPC ..................... 29/428, 458; 313/503; 250/311; 977/861, 880
See application file for complete search history.

(56) References Cited

U.S. PATENT DOCUMENTS

| | | | |
|---|---|---|---|
| 4,672,797 A | 6/1987 | Hagler | |
| 7,045,108 B2 * | 5/2006 | Jiang et al. | 423/447.2 |
| 7,641,885 B2 * | 1/2010 | Liu et al. | 423/447.3 |
| 7,704,480 B2 * | 4/2010 | Jiang et al. | 423/447.2 |
| 8,371,892 B2 * | 2/2013 | Wei et al. | 445/50 |
| 8,387,227 B2 * | 3/2013 | Liu et al. | 29/458 |
| 2006/0138954 A1 * | 6/2006 | Kato et al. | 313/553 |
| 2007/0210253 A1 | 9/2007 | Behar et al. | |
| 2008/0237464 A1 | 10/2008 | Zhang et al. | |
| 2008/0248235 A1 * | 10/2008 | Feng et al. | 428/113 |
| 2008/0250881 A1 | 10/2008 | Dona | |
| 2008/0299031 A1 * | 12/2008 | Liu et al. | 423/447.3 |
| 2008/0299460 A1 * | 12/2008 | Feng et al. | 429/231.8 |
| 2009/0317926 A1 * | 12/2009 | Zhang et al. | 438/20 |
| 2010/0038557 A1 | 2/2010 | Zach | |
| 2011/0017921 A1 * | 1/2011 | Jiang et al. | 250/440.11 |
| 2011/0141741 A1 * | 6/2011 | Engstrom et al. | 362/257 |

FOREIGN PATENT DOCUMENTS

| | | |
|---|---|---|
| CN | 101276724 A | 10/2008 |
| CN | 101609771 A | 12/2009 |
| JP | 9-199069 | 7/1997 |
| JP | 2004-45359 | 2/2004 |
| JP | 2006-244742 | 9/2006 |
| JP | P2006-244742 A | 9/2006 |
| JP | 2007-317566 | 12/2007 |
| TW | 201003712 | 10/2010 |
| WO | WO2007015710 | 2/2007 |

OTHER PUBLICATIONS

Zhang et al., Superaligned Carbon Nanotube Grid for High Resolution Transmission Electron Microscopy of Nanomaterials, Nano Letters, 2008, vol. 8, No. 8, p. 2564-2569.

* cited by examiner

*Primary Examiner* — Minh Trinh
(74) *Attorney, Agent, or Firm* — Altis Law Group, Inc.

(57) ABSTRACT

A method for manufacturing a transmission electron microscope (TEM) micro-grid is provided. A support ring and a sheet-shaped carbon nanotube structure precursor are first provided. The sheet-shaped carbon nanotube structure precursor is then disposed on the support ring. The sheet-shaped carbon nanotube structure precursor is cut to form a sheet-shaped carbon nanotube structure in desired shape. The sheet-shaped carbon nanotube structure is secured on the support ring.

18 Claims, 11 Drawing Sheets

METHOD FOR MANUFACTURING TRANSMISSION ELECTRON MICROSCOPE MICRO-GRID

CROSS-REFERENCE TO RELATED APPLICATIONS

This application claims all benefits accruing under 35 U.S.C. §119 from China Patent Application No. 201010146837.9, filed on 2010 Apr. 14, in the China Intellectual Property Office, the disclosure of which is incorporated herein by reference. This application is related to the application entitled, "TRANSMISSION ELECTRON MICROSCOPE MICRO-GRID", filed Nov. 11, 2010 12/944,158. Disclosure of the above-identified applications are incorporated herein by reference.

BACKGROUND

1. Technical Field

The present disclosure relates to methods for manufacturing transmission electron microscope micro-grids, and particularly to a method for manufacturing transmission electron microscope micro-grid based on carbon nanotubes.

2. Description of Related Art

In a transmission electron microscope, a porous carbon supporting film (i.e., micro-grid) can be used to carry powder samples and to observe high resolution transmission electron microscope images. With the development of nanotechnology, micro-grids are increasingly coming into widespread use in the field of electron microscopy. The micro-grids used in transmission electron microscopes are usually manufactured using a layer of organic porous membrane covered on a metal mesh net, such as a copper mesh net, or nickel mesh net, and subsequently a layer of non-crystal carbon films are deposited thereon via evaporation.

However, the metal mesh nets usually contain impurities such as metal oxide, which can cause interference in the component analysis of observed samples.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
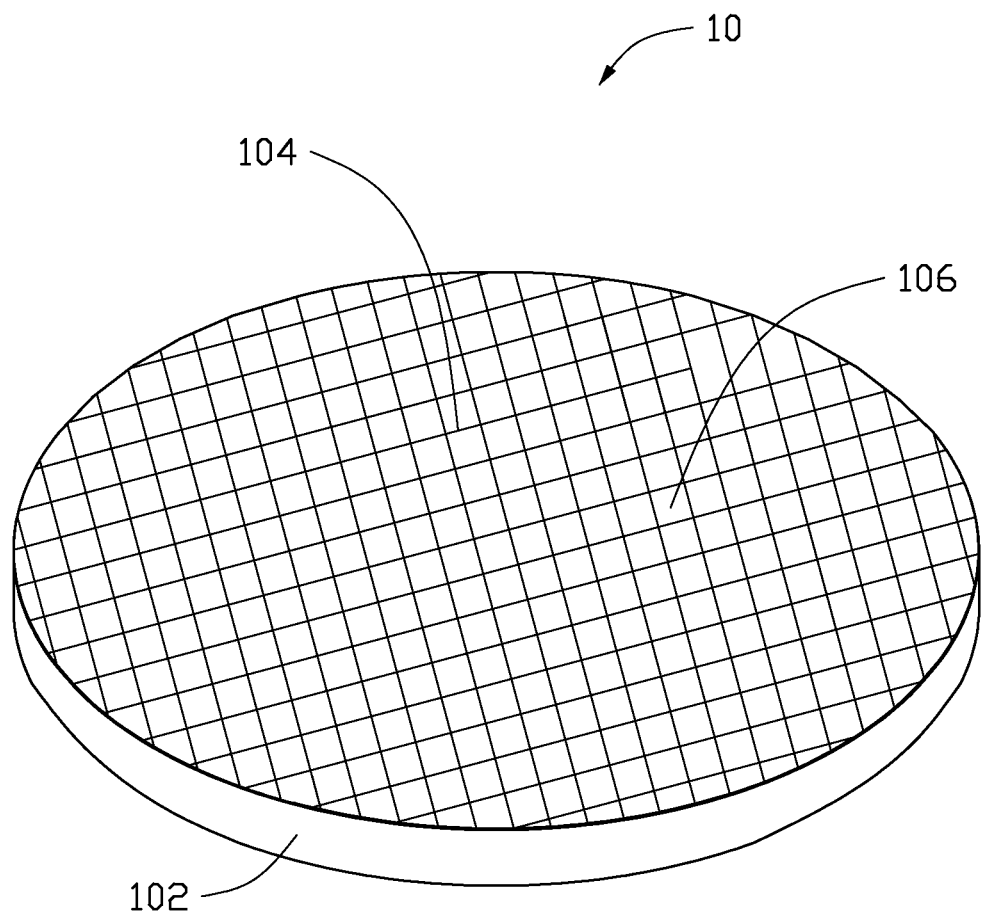
FIG. 1 is a schematic perspective view of one embodiment of a transmission electron microscope (TEM) micro-grid.
Figure 2:
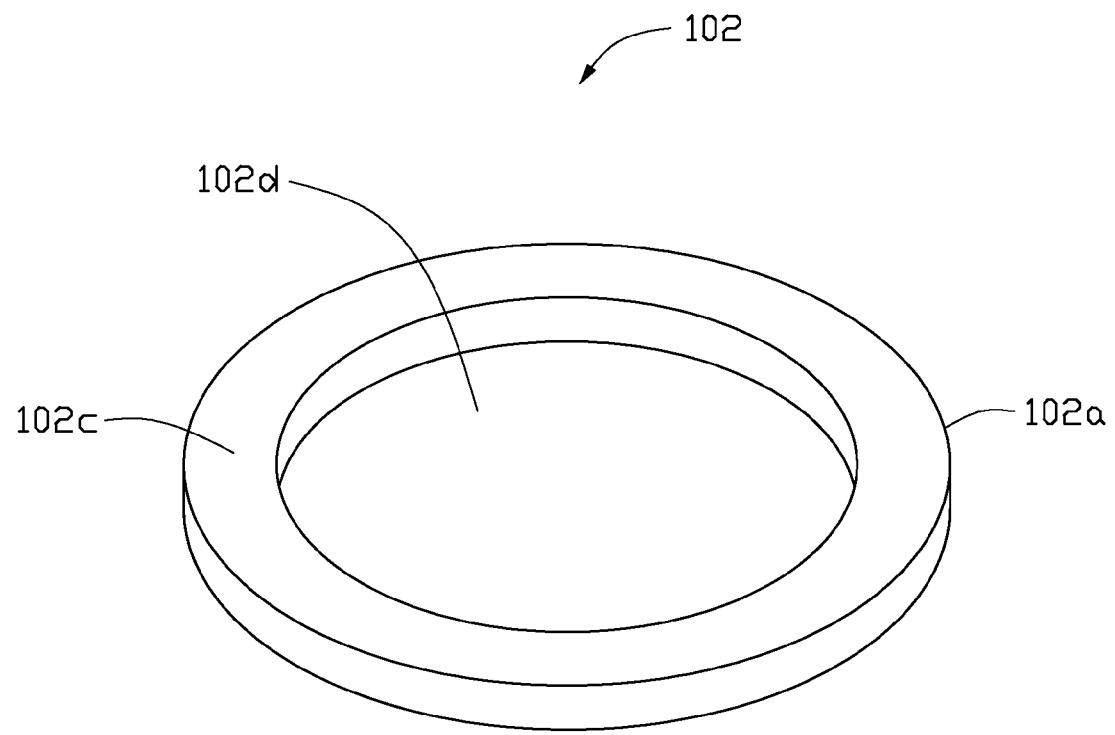
FIG. 2 is a schematic perspective view of a support ring of the TEM micro-grid of FIG. 1, but with flanges of the support ring unfolded.

Referring to FIGS. 1 and 2, one embodiment of a TEM micro-grid 10 includes a support ring 102 and a substantially sheet-shaped carbon nanotube structure 104.

The support ring 102 is used to secure the sheet-shaped carbon nanotube structure 104 thereon. The support ring 102 can be a substantially round ring with a diameter substantially equal to that of the sheet-shaped carbon nanotube structure 104. The support ring 102 can have a support body 102a and a through hole 102d defined by the support body 102a. In one embodiment, the diameter of the support ring 102 is about 3 mm.

The support ring 102 can be made of metal or ceramics. The metal can be copper, molybdenum, or nickel. The shape of the cross-section of the support ring 102 in a plane perpendicular to the support ring 102 can be square, round, semi-circle or trapezium. In one embodiment, the support ring 102 can have a smooth mounting surface 102c to engage with the sheet-shaped carbon nanotube structure 104.

The sheet-shaped carbon nanotube structure 104 can be secured on the smooth mounting surface 102c via adhesives, Van der Waals attractive force, mechanical means, or any combination thereof. If the sheet-shaped carbon nanotube structure 104 is secured with adhesives, a layer of the adhesives can be first coated on the smooth mounting surface 102c and the sheet-shaped carbon nanotube structure 104 is then put on and secured to the smooth mounting surface 102c with the adhesives.

If the sheet-shaped carbon nanotube structure 104 is secured via Van der Waals attractive force, the sheet-shaped carbon nanotube structure 104 can be directly secured on the smooth mounting surface 102c by the adhesion of the sheet-shaped carbon nanotube structure 104 or by treatment of organic solvents. If the sheet-shaped carbon nanotube structure 104 is secured by treatment of organic solvent, the organic solvent can be dropped on a surface of the sheet-shaped carbon nanotube structure 104, which is put on the support ring 102, to soak the sheet-shaped carbon nanotube structure 104. After being soaked by the organic solvent, two or more neighboring carbon nanotubes of the sheet-shaped carbon nanotube structure 104 will be closer together. The binding force between the sheet-shaped carbon nanotube structure 104 and the support ring 102 can be improved. The organic solvent is volatile and can be ethanol, methanol, acetone, dichloroethane, chloroform, and any combination thereof.

Figure 3:
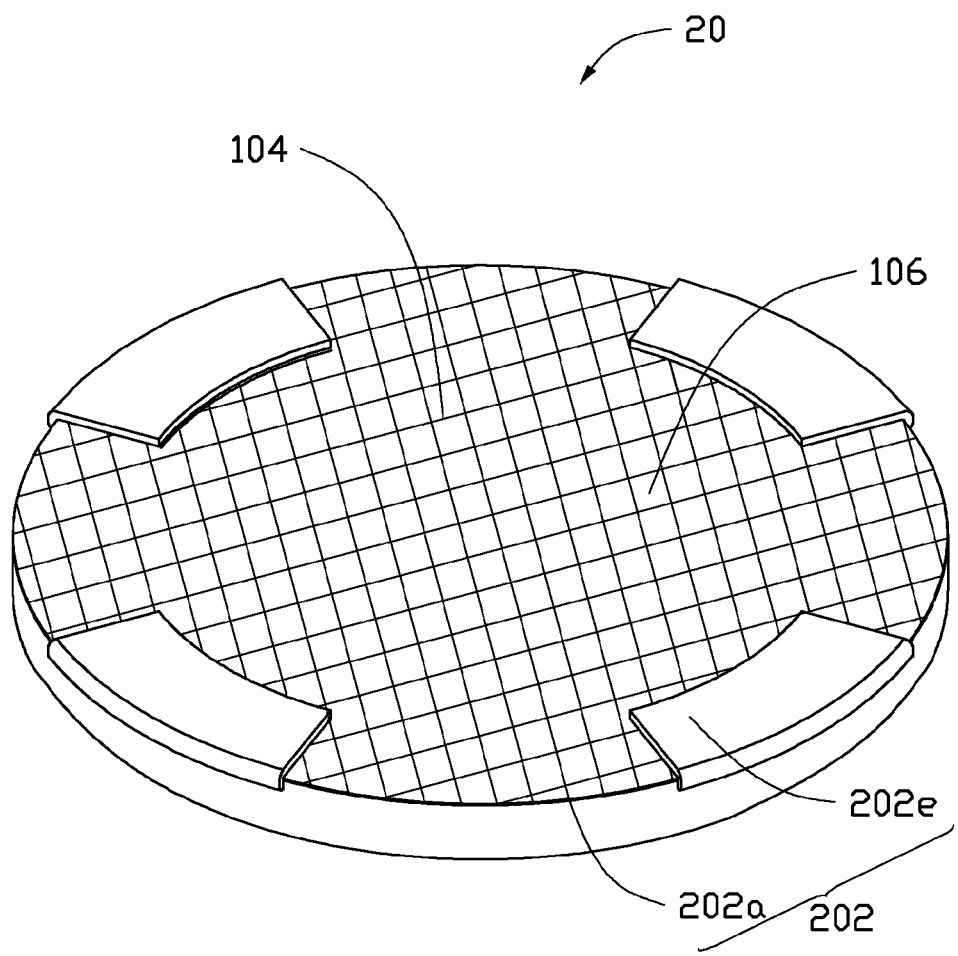
FIG. 3 is a schematic perspective view of another embodiment of a TEM micro-grid.
Figure 4:
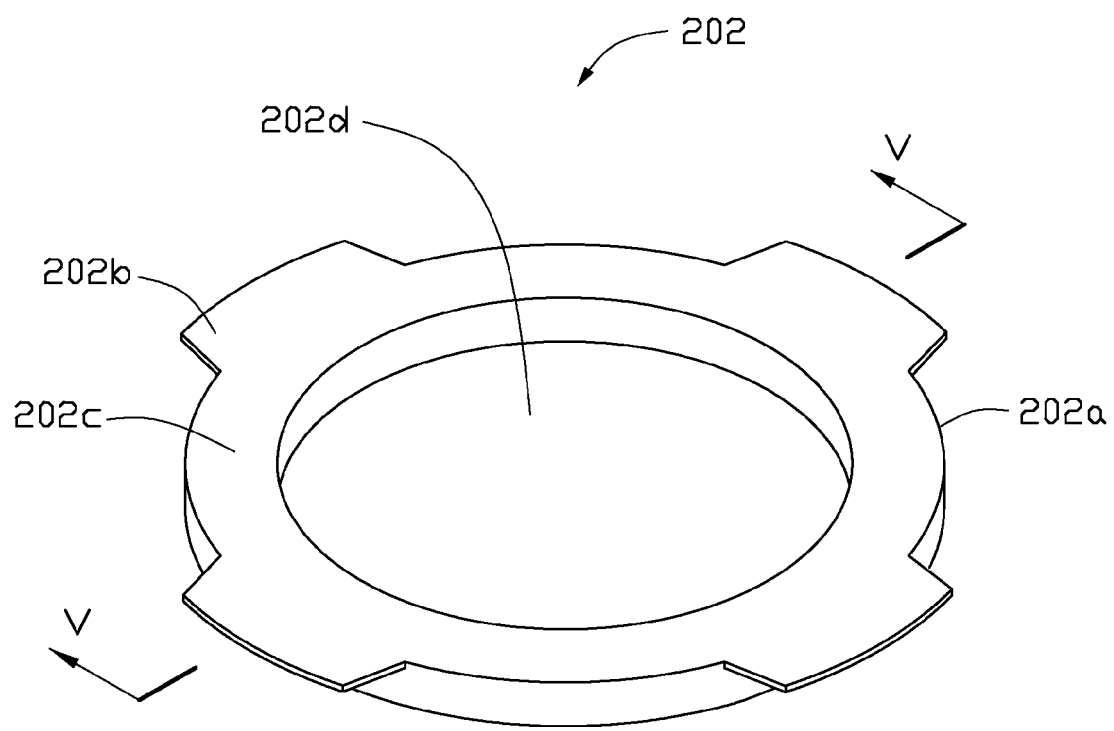
FIG. 4 is a schematic perspective view of a support ring of the TEM micro-grid of FIG. 3, but with flanges of the support ring unfolded.
Figure 5:
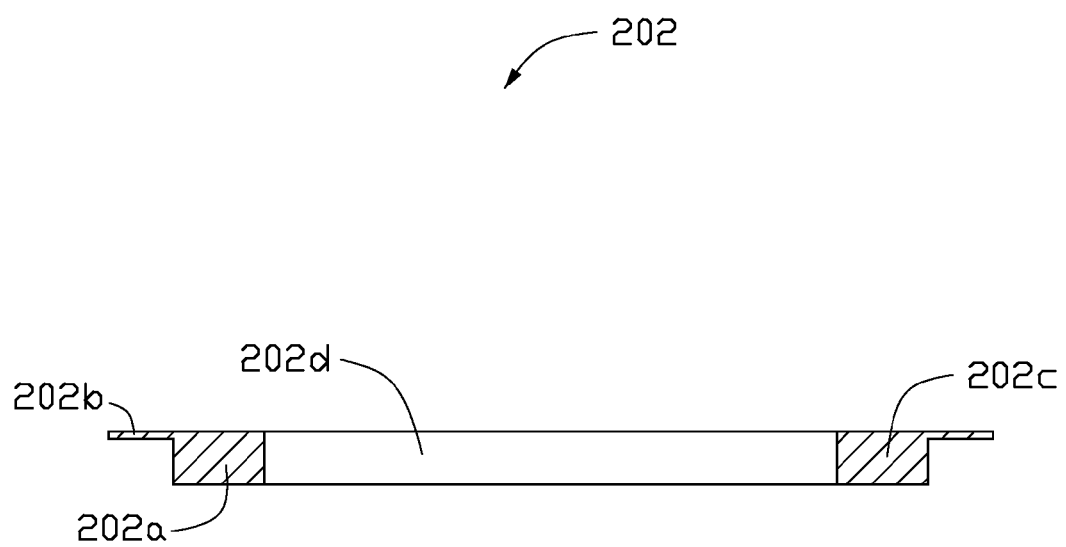
FIG. 5 is a transverse cross-section along line V-V of FIG. 4.

In other embodiments, the sheet-shaped carbon nanotube structure 104 can be secured by mechanical means. Referring to FIGS. 3-5, one embodiment of a TEM micro-grid 20 includes a support ring 202 and a sheet-shaped carbon nanotube structure 104. The support ring 202 includes a support body 202a and a number of flanges 202e. The flanges 202e is distorted inwards relative to the support body 202a, to secure the sheet-shaped carbon nanotube structure 104 between the support body 202a and the flanges 202e.

The support body 202a and the flanges 202b can be integrally formed and can be made of copper. The number of the flanges 202b is not limited, so long as the flanges 202b can secure the sheet-shaped carbon nanotube structure 104 on the support ring 202. If the number of the flanges is one, the single flange can extend along a periphery of the support body 202a and can be distorted or pressed to push the sheet-shaped carbon nanotube structure 104 towards the support body 202a.

The support body 202a can be a round ring and have a diameter of about 3 mm. The support body 202a can have a smooth mounting surface 202c to engage with the sheet-shaped carbon nanotube structure 104. The support body 202a can have a through hole 202d defined therein.

The flanges 202b extend radially from an outer lateral surface of the support body 202a. The flanges 202b can be located on an extended surface of the smooth mounting surface 202c. In other embodiments, the flanges (not shown) are located in a plane below the smooth mounting surface 202c. The thickness of the flanges 202b can be smaller than or equal to the thickness of the support body 202a. As shown in FIG. 4, there are four flanges 202b extending symmetrically and radially from the outer lateral surface of the support body 202a. With this design, the sheet-shaped carbon nanotube structure 104 can be easily secured on the support ring 202.

When assembling the sheet-shaped carbon nanotube structure 104 on the support ring 202, the sheet-shaped carbon nanotube structure 104 can be first positioned on the smooth mounting surface 202c. The flanges 202b are then distorted inwards relative to the support body 202a until the flanges 202b overlap the smooth mounting surface 202c and push the sheet-shaped carbon nanotube structure 104 towards the smooth mounting surface 202c. Thus, the sheet-shaped carbon nanotube structure 104 can be tightly clamped between the smooth mounting surface 202c and the flanges 202b.

The sheet-shaped carbon nanotube structure 104 is used to carry powder samples. The sheet-shaped carbon nanotube structure 104 can be a porous structure and include a number of micropores 106. The micropores 106 can extend through opposite surfaces of the sheet-shaped carbon nanotube structure 104. The shape of the micropores 106 is not limited, and the micropores 106 can be fabricated into many shapes, such as round, elliptical, and square, to adapt to actual needs.

The size or diameter of the micropores 106 is not limited, and can be adjusted according to actual needs. In one embodiment, the diameter of the micropores 106 can range from about 1 μm to about 200 μm. The distribution of the micropores 106 is not limited. The distances between adjacent micropores 106 can be equal or different. The micropores 106 can be uniformly distributed in the sheet-shaped carbon nanotube structure 104. The micropores 106 can also be arranged in an array, and the distances between adjacent micropores 106 can be equal to or greater than 1 μm.

The sheet-shaped carbon nanotube structure 104 can be a free-standing structure. The term "free-standing structure" can be defined as a structure that does not have to be supported by a substrate. For example, a free-standing structure can sustain its weight when hoisted by a portion thereof without any significant damage to its structural integrity.

The sheet-shaped carbon nanotube structure 104 can include at least one linear carbon nanotube structure or at least one carbon nanotube film.

If the sheet-shaped carbon nanotube structure 104 includes a number of linear carbon nanotube structures, the number of linear carbon nanotube structures can be substantially parallel to each other (not shown), crossed with each other, or woven together to form the sheet-shaped carbon nanotube structure 104. The linear carbon nanotube structure can include one or more carbon nanotube wires. The carbon nanotube wires in the linear carbon nanotube structure can be substantially parallel to each other to form a bundle-like structure or twisted with each other to form a twisted structure.

Figure 6:
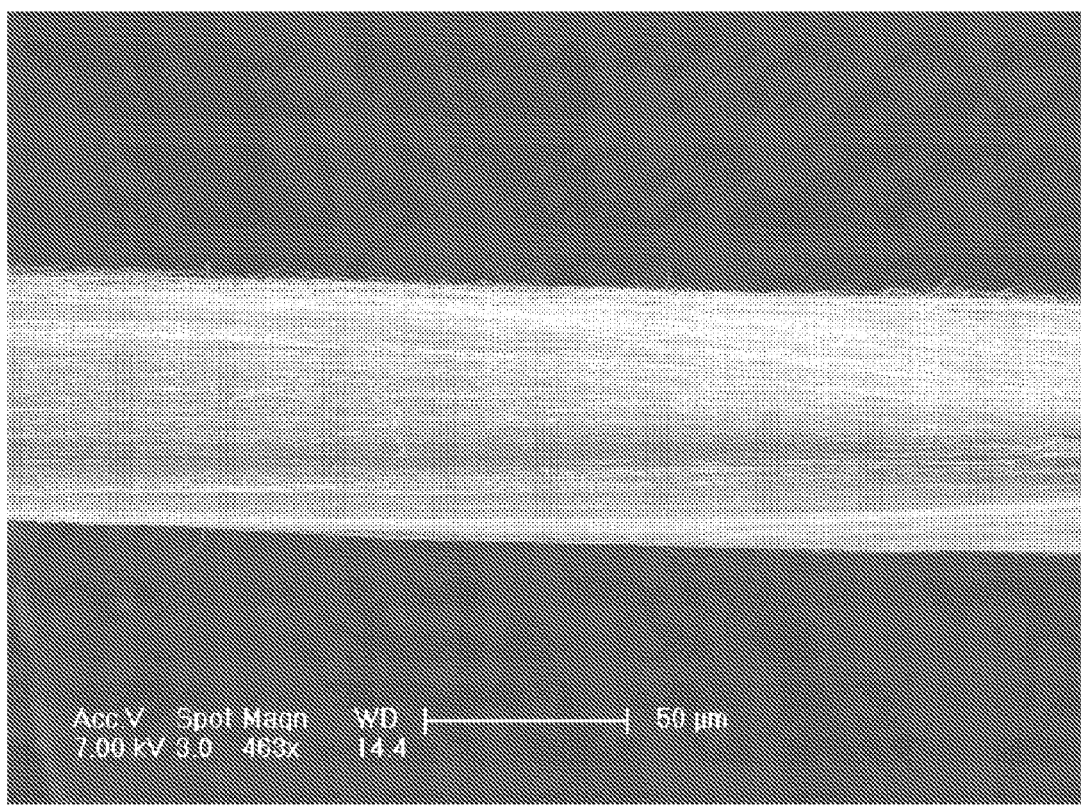
FIG. 6 is a Scanning Electron Microscope (SEM) image of an untwisted carbon nanotube wire.

The carbon nanotube wire can be an untwisted carbon nanotube wire or a twisted carbon nanotube wire. An untwisted carbon nanotube wire is formed by treating a carbon nanotube film with an organic solvent. Referring to FIG. 6, the untwisted carbon nanotube wire includes a plurality of successive carbon nanotubes, which are substantially oriented along the linear direction of the untwisted carbon nanotube wire and joined end-to-end by Van der Waals attraction force therebetween. The untwisted carbon nanotube wire has a diameter ranging from about 0.5 nm to about 1 mm. Examples of an untwisted carbon nanotube wire are taught by U.S. Pat. No. 7,045,108 to Jiang et al., and U.S. Pat. No. 7,704,480 to Jiang et al.

Figure 7:
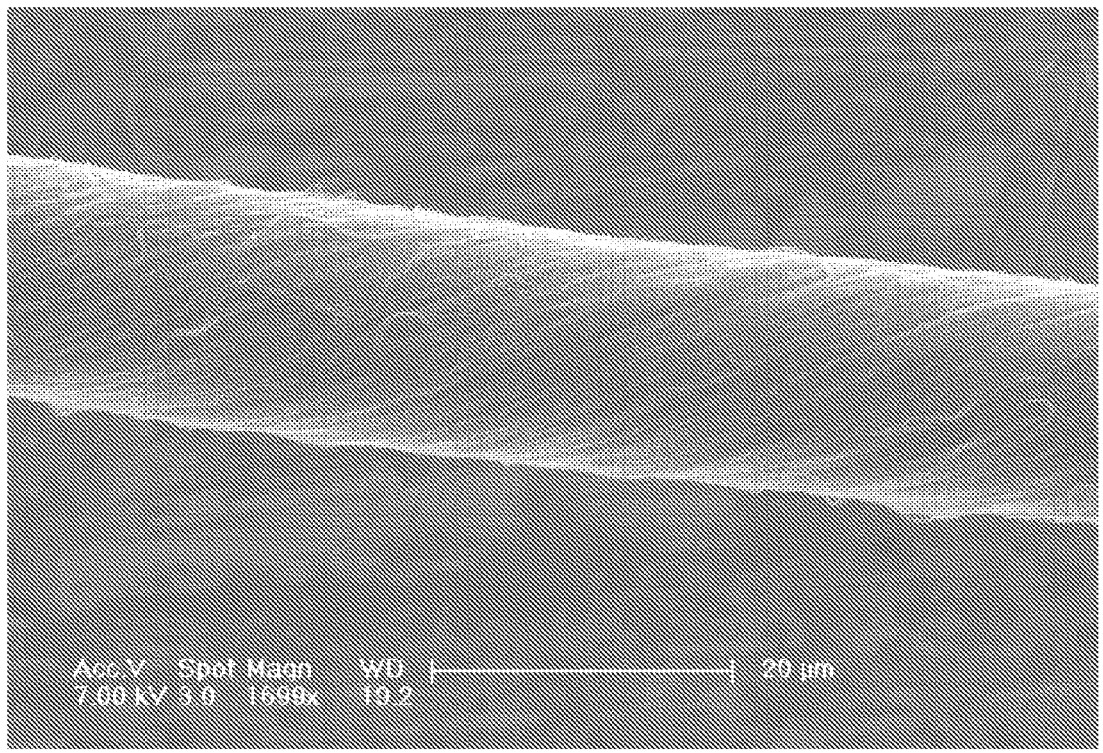
FIG. 7 is an SEM image of a twisted carbon nanotube wire.

A twisted carbon nanotube wire is formed by twisting a carbon nanotube film by using a mechanical force. Referring to FIG. 7, the twisted carbon nanotube wire includes a plurality of carbon nanotubes oriented around an axial direction of the twisted carbon nanotube wire. The length of the twisted carbon nanotube wire can be set as desired and the diameter of the carbon nanotube wire can range from about 0.5 nanometers to about 100 micrometers. The twisted carbon nanotube wire can be treated with an organic solvent before or after twisting.

The at least one carbon nanotube film can be a flocculated carbon nanotube film, a pressed carbon nanotube film, or a drawn carbon nanotube film.

Flocculated Carbon Nanotube Film

Figure 8:
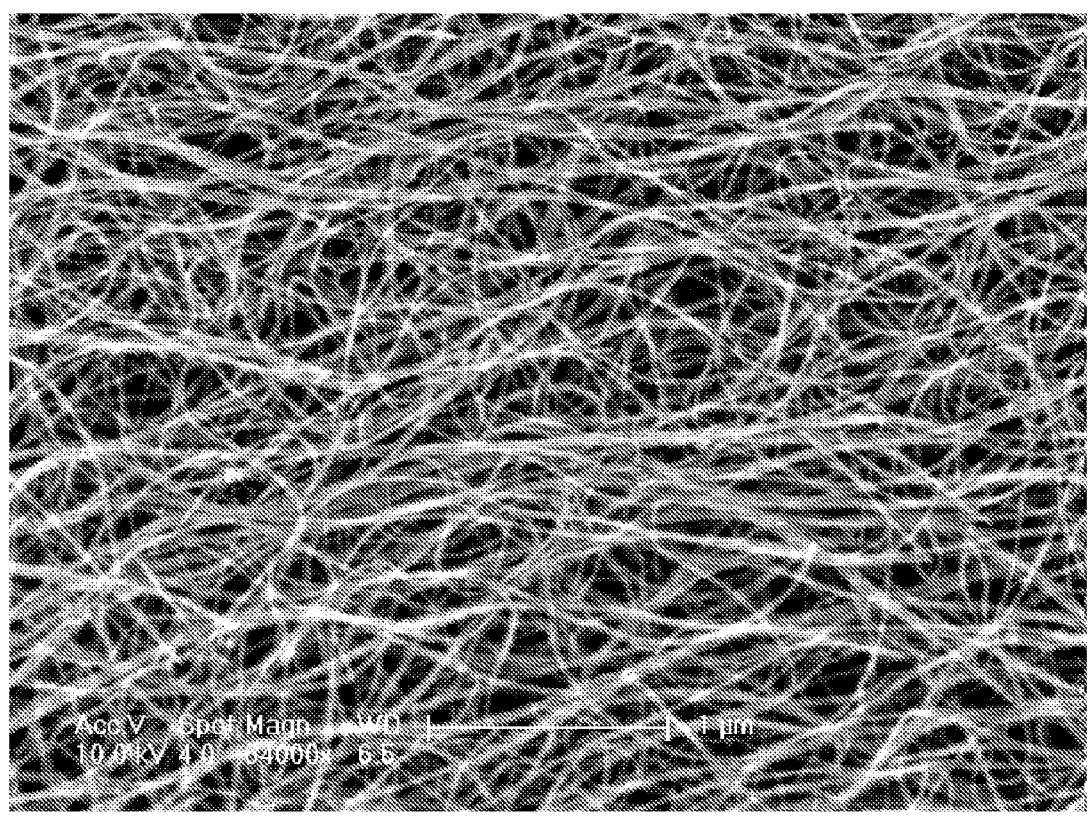
FIG. 8 is an SEM image of a flocculated carbon nanotube film.

In some embodiments, the sheet-shaped carbon nanotube structure 104 can include a flocculated carbon nanotube film. Referring to FIG. 8, the flocculated carbon nanotube film can include a plurality of long, curved, disordered carbon nanotubes entangled with each other. Further, the flocculated carbon nanotube film can be isotropic. The carbon nanotubes can be substantially uniformly dispersed in the carbon nanotube film. Adjacent carbon nanotubes are acted upon by Van der Waals attractive force to obtain an entangled structure with micropores defined therein. It is understood that the flocculated carbon nanotube film is very porous. The sizes of the micropores can be less than 10 μm. The porous nature of the flocculated carbon nanotube film will increase the specific surface area of the sheet-shaped carbon nanotube structure 104. Because the carbon nanotubes in the sheet-shaped carbon nanotube structure 104 are entangled with each other, the sheet-shaped carbon nanotube structure 104 employing the flocculated carbon nanotube film has excellent durability, and can be fashioned into desired shapes with a low risk to the integrity of the sheet-shaped carbon nanotube structure 104. The thickness of the flocculated carbon nanotube film can range from about 1 μm to about 1 mm.

It is understood that the sheet-shaped carbon nanotube structure 104 can include a single layer of flocculated carbon nanotube film, the single layer of flocculated carbon nanotube film can provide suitable support by adjusting the thickness thereof.

Pressed Carbon Nanotube Film

Figure 9:
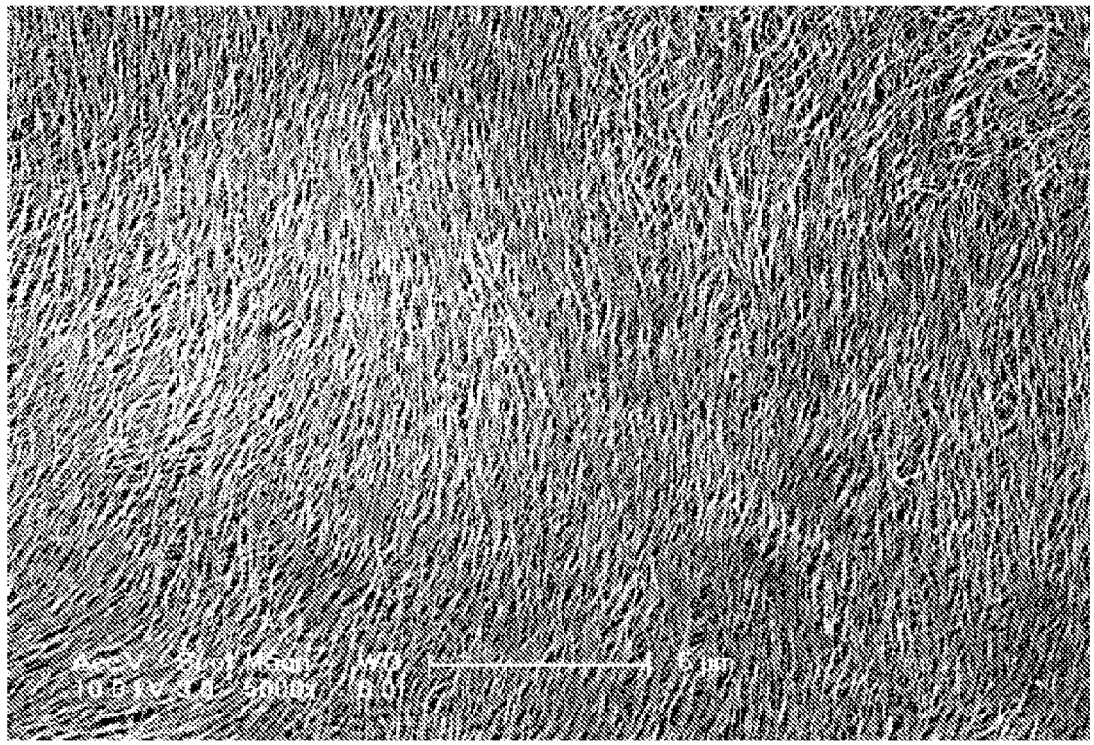
FIG. 9 is an SEM image of a pressed carbon nanotube film.

In other embodiments, the sheet-shaped carbon nanotube structure 104 can include at least a pressed carbon nanotube film. Referring to FIG. 9, the pressed carbon nanotube film can be a free-standing carbon nanotube film. The carbon nanotubes in the pressed carbon nanotube film can be arranged along a same direction or along different directions. The carbon nanotubes in the pressed carbon nanotube film can rest upon each other. Adjacent carbon nanotubes are attracted to each other and combined by Van der Waals attractive force. An angle between a primary alignment direction of the carbon nanotubes and a surface of the pressed carbon nanotube film is about 0 degrees to approximately 15 degrees. The greater the pressure applied, the smaller the angle obtained. If the carbon nanotubes in the pressed carbon nanotube film are arranged along different directions, the sheet-shaped carbon nanotube structure 104 can be isotropic. Here, "isotropic" means the carbon nanotube film has identical properties in all directions substantially parallel to a surface of the carbon nanotube film. The thickness of the pressed carbon nanotube film can range from about 0.5 nm to about 1 mm. Examples of a pressed carbon nanotube film are taught by US PGPub. 20080299031A1 to Liu et al.

It is understood that the sheet-shaped carbon nanotube structure 104 can include a single layer of pressed carbon nanotube film, the single layer of pressed carbon nanotube film can provide suitable support by adjusting the thickness thereof.

Drawn Carbon Nanotube Film

In one embodiment, the sheet-shaped carbon nanotube structure 104 can include at least one drawn carbon nanotube film. Examples of a drawn carbon nanotube film are taught by U.S. Pat. No. 7,045,108 to Jiang et al., and WO 2007015710 to Zhang et al.

The carbon nanotube drawn film includes a plurality of carbon nanotubes that can be arranged substantially parallel to a surface of the carbon nanotube drawn film. A large number of the carbon nanotubes in the carbon nanotube drawn film can be oriented along a preferred orientation, meaning that a large number of the carbon nanotubes in the carbon nanotube drawn film are arranged substantially along the same direction. An end of one carbon nanotube is joined to another end of an adjacent carbon nanotube arranged substantially along the same direction, by Van der Waals attractive force. A small number of the carbon nanotubes are randomly arranged in the carbon nanotube drawn film, and has a small if not negligible effect on the larger number of the carbon nanotubes in the carbon nanotube drawn film arranged substantially along the same direction. The carbon nanotube film is capable of forming a free-standing structure. So, if the carbon nanotube drawn film is placed between two separate supporters, a portion of the carbon nanotube drawn film, not in contact with the two supporters, would be suspended between the two supporters and yet maintain film structural integrity. The free-standing structure of the carbon nanotube drawn film is realized by the successive carbon nanotubes joined end to end by Van der Waals attractive force.

Figure 10:
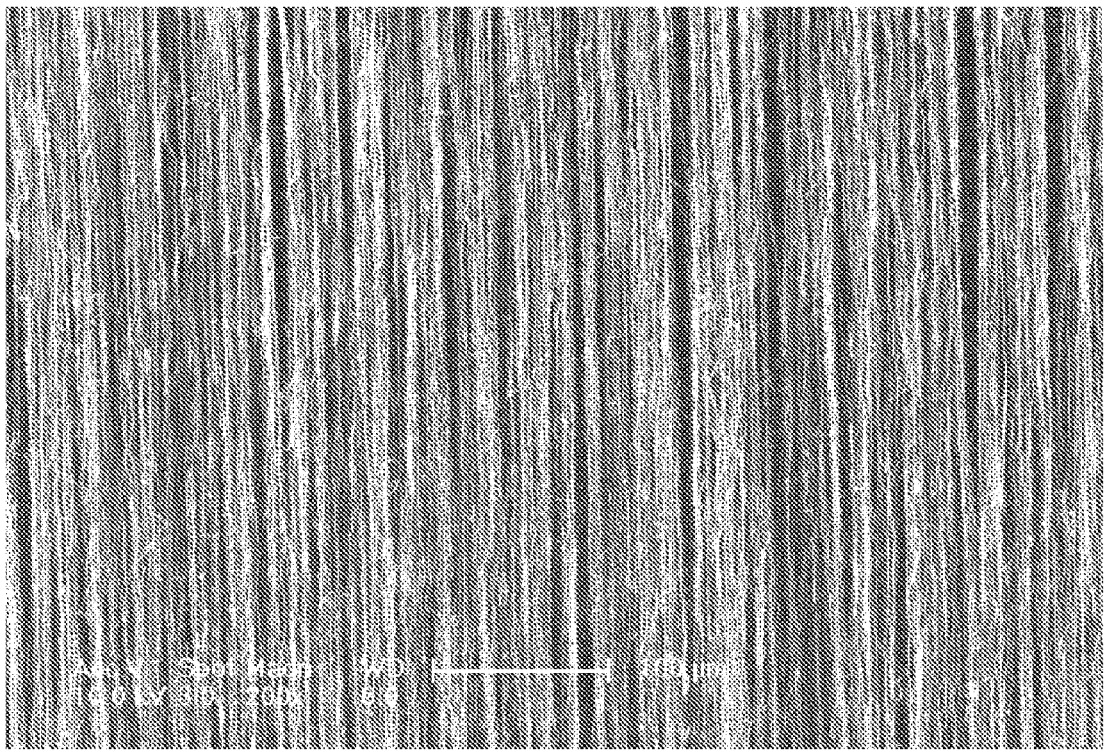
FIG. 10 is an SEM image of a drawn carbon nanotube film.

It can be appreciated that some variation can occur in the orientation of the carbon nanotubes in the carbon nanotube drawn film as can be seen in FIG. 10. Microscopically, the carbon nanotubes oriented substantially along the same direction may not be perfectly aligned in a straight line, and some curve portions may exist. It can be understood that some carbon nanotubes located substantially side by side and oriented along the same direction contacting each other can not be excluded.

Figure 11:
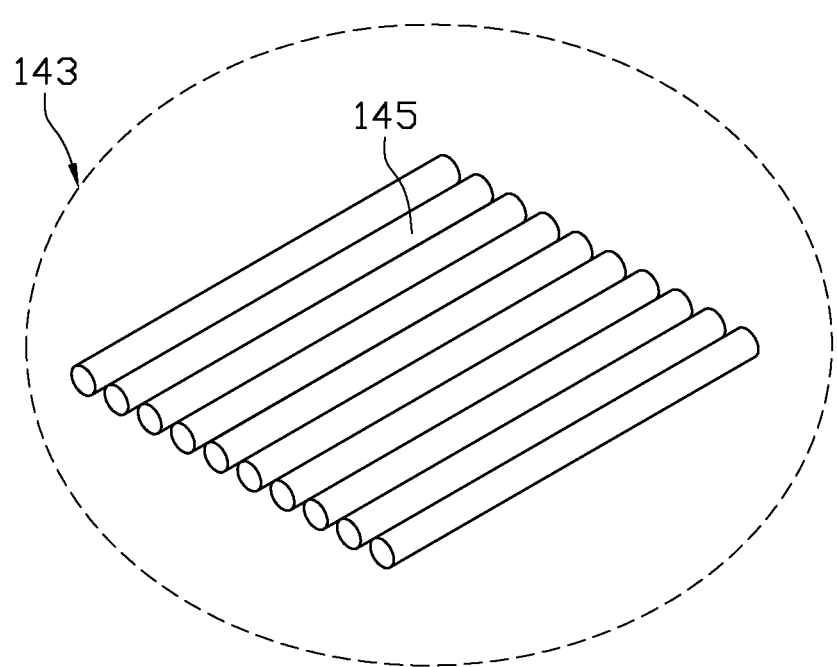
FIG. 11 is a schematic of a carbon nanotube segment.

More specifically, referring to FIG. 11, the carbon nanotube drawn film includes a plurality of successively oriented carbon nanotube segments 143 joined end-to-end by Van der Waals attractive force therebetween. Each carbon nanotube segment 143 includes a plurality of carbon nanotubes 145 substantially parallel to each other, and joined by Van der Waals attractive force therebetween. The carbon nanotube segments 143 can vary in width, thickness, uniformity, and shape. The carbon nanotubes 145 in the carbon nanotube drawn film 143 are also substantially oriented along a preferred orientation.

The sheet-shaped carbon nanotube structure 104 can also include at least two stacked drawn carbon nanotube films. In other embodiments, the sheet-shaped carbon nanotube structure 104 can include two or more coplanar drawn carbon nanotube films. Coplanar drawn carbon nanotube films can also be stacked upon other coplanar films. Additionally, an angle can exist between the orientation of carbon nanotubes in adjacent drawn films, stacked and/or coplanar. Adjacent drawn carbon nanotube films can be combined by only Van der Waals attractive forces therebetween without the need of an additional adhesive. An angle between the aligned directions of the carbon nanotubes in the two adjacent drawn carbon nanotube films can range from about 0 degrees to about 90 degrees.

In one embodiment, the sheet-shaped carbon nanotube structure 104 is formed of a number of linear carbon nanotube structures woven by plain weave. The diameter of the sheet-shaped carbon nanotube structure 104 is about 3 mm. The peripheral edge of the sheet-shaped carbon nanotube structure 104 is secured between the support body 202a and the flanges 202b and functions as a mounting portion. The central portion of the sheet-shaped carbon nanotube structure 104 is suspended above the through hole 202d and functions as a working area for the TEM micro-grid 20.

As described above, the peripheral edge of the sheet-shaped carbon nanotube structure 104 is secured on the support ring 102/202 and the central portion of the sheet-shaped carbon nanotube structure 104 is suspended above the through hole 102d/202d. Thus, in the work area of the TEM micro-grid 10/20, there is no mesh net or other components except the sheet-shaped carbon nanotube structure 104. Therefore, the interference caused by the metal mesh nets of the typical TEMS in the component analysis of samples can be eliminated or greatly reduced. Therefore, the accuracy of a TEM adopting the TEM micro-grid 102/202 can be improved.

Further, the sheet-shaped carbon nanotube structure 104 is secured on the support ring 102/202, and the TEM micro-grid 10/20 can be moved using tweezers to clamp the outer lateral surface of the support body 202a. The tweezers will not come into contact with the sheet-shaped carbon nanotube structure 104, to prevent the sheet-shaped carbon nanotube structure 104 from being contaminated by the tweezers.

In one application of the TEM micro-grid 20, the sample to be observed is disposed on the TEM micro-grid 20. In detail, if the sample is larger than the micropores 106, the sample can be placed on a surface of the sheet-shaped carbon nanotube structure 104 and span across at least one of the micropores 106. If the sample is smaller than the diameter or size of the micropores 106, particularly if the sample is smaller than about 5 nm, the sample can be adhered to the walls of the carbon nanotubes of the sheet-shaped carbon nanotube structure 104.

One embodiment of a method for fabricating the TEM micro-grid 10/20 includes the steps:

(a) providing a support ring 102/202 as described above and a sheet-shaped carbon nanotube structure precursor; in this step, the sheet-shaped carbon nanotube structure precursor can be one of the carbon nanotube structures described above;

(b) disposing the sheet-shaped carbon nanotube structure precursor on the support ring 102/202, and cutting the sheet-shaped carbon nanotube structure precursor to form the sheet-shaped carbon nanotube structure 104 in a desired shape;

(c) securing the sheet-shaped carbon nanotube structure 104 on the support ring 102/202, to form the TEM micro-grid 10/20; in this step, the sheet-shaped carbon nanotube structure 104 can be secured on the support ring 102/202 with adhesives, Van der Waals attractive force, mechanical means or a combination thereof described above.

In step (b), the sheet-shaped carbon nanotube structure precursor can be provisionally installed on the support ring 102/202 by pressing portions of the sheet-shaped carbon nanotube structure precursor corresponding to the support body 102a/202a towards the support body 102a/202a via molds or flanges 202b. A laser beam can be used to cut the sheet-shaped carbon nanotube structure precursor to form the sheet-shaped carbon nanotube structure 104 to the desired shape. The laser beam can be generated by an argon ion laser or carbon dioxide laser. The laser beam has a power of approximately about 5 watts to about 30 watts. The power is about 18 watts in one embodiment. The laser beam can be focused by a lens and irradiate portions of the sheet-shaped carbon nanotube structure precursor around the outer edge of the TEM micro-grid 10/20. Carbon nanotubes in the irradiated portions absorb the laser beam energy, react with the oxygen in the air, and then decompose. Thus, the TEM micro-grid 10/20 is cut off.

In one embodiment, the sheet-shaped carbon nanotube structure precursor can be fixed, and the laser beam can be moved to irradiate the sheet-shaped carbon nanotube structure precursor to form the TEM micro-grid 10/20. In another embodiment, the laser beam can be fixed, and the sheet-shaped carbon nanotube structure precursor can be moved relative to the laser beam to form the TEM micro-grid 10/20. The sheet-shaped carbon nanotube structure precursor can also be fabricated into the sheet-shaped carbon nanotube structure 104 by other methods, such as chemical etching.

Additionally, the method can further include a step of treating the sheet-shaped carbon nanotube structure precursor or the sheet-shaped carbon nanotube structure 104 with an organic solvent. The organic solvent is volatile and can be ethanol, methanol, acetone, dichloroethane, chloroform, and any combination thereof. In one embodiment, the organic solvent is ethanol. In one embodiment, the organic solvent can be dropped on a surface of the sheet-shaped carbon nanotube structure precursor or the sheet-shaped carbon nanotube structure 104 with a dropper. In another embodiment, the sheet-shaped carbon nanotube structure 104 together with the support body 102a/202a is immersed into a container having an organic solvent therein. After being treated by the organic solvent, two or more neighboring carbon nanotubes of the sheet-shaped carbon nanotube structure 104 will be closer together. The mechanical properties of the sheet-shaped carbon nanotube structure 104 can be improved. Further, the binding force between the sheet-shaped carbon nanotube structure 104 and the support body 102a/202a can also be improved after being soaked by the organic solvent.

It can be understood that in one embodiment, a large sheet-shaped carbon nanotube structure precursor can be used to cover a number of support bodies 102a/202a before cutting, so that a number of sheet-shaped carbon nanotube structures 104 can be fabricated in mass production.

According to the above descriptions, the TEM grid of the present disclosure has the following advantages.

(1) Because only the peripheral edge of the sheet-shaped carbon nanotube structure 104 is secured on the support ring 102/202, there is no mesh net or other components in the work area of the TEM micro-grid except the sheet-shaped carbon nanotube structure. Therefore, the interference caused by the metal mesh nets of the typical TEMS in the component analysis of samples can be eliminated or greatly reduced. Therefore, the accuracy of a TEM adopting the TEM micro-grid can be improved.

(2) Because the sheet-shaped carbon nanotube structure is secured on the support ring, the TEM micro-grid can be moved by a tool, such as tweezers, to clamp the outer lateral surface of the support body. The tweezers will not come into contact with the sheet-shaped carbon nanotube structure, thus preventing the sheet-shaped carbon nanotube structure from contamination by the tweezers.

(3) The TEM micro-grid in the present disclosure can be formed by securing a sheet-shaped carbon nanotube structure on a support ring. Thus, the method is simple, fast, and capable of large-scale production.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

It is also to be understood that above description and the claims drawn to a method may include some indication in reference to certain steps. However, the indication used is only to be viewed for identification purposes and not as a suggestion as to an order for the steps.

What is claimed is:

1. A method for manufacturing a transmission electron microscope (TEM) micro-grid comprising:
   providing a support ring comprising a metal and a sheet-shaped carbon nanotube structure precursor;
   disposing the sheet-shaped carbon nanotube structure precursor on the support ring;
   cutting the sheet-shaped carbon nanotube structure precursor to form a sheet-shaped carbon nanotube structure in a desired shape; and
   securing the sheet-shaped carbon nanotube structure on the support ring,
   wherein the support ring comprises a support body having a smooth mounting surface and at least one flange extending from the support body; in the step of securing, the at least one flange is distorted towards to the smooth mounting surface of the support body until the sheet-shaped carbon nanotube structure is secured by the at least one flange.

2. The method of claim 1, wherein the support ring comprises a support body and a through hole defined by the support body, and in the step of securing, a periphery edge of the sheet-shaped carbon nanotube structure is secured on the support body and a central area of the sheet-shaped carbon nanotube structure is suspended above the through hole.

3. The method of claim 1, wherein the support ring is a round ring with a diameter substantially equal to that of the sheet-shaped carbon nanotube structure.

4. The method of claim 1, wherein the support ring comprises a smooth mounting surface, and in the step of securing, the sheet-shaped carbon nanotube structure is secured on the smooth mounting surface.

5. The method of claim 4, wherein in the step of securing, the sheet-shaped carbon nanotube structure is secured on the smooth mounting surface via adhesives, Van der Waals, mechanical means or any combination thereof.

6. The method of claim 1, wherein the sheet-shaped carbon nanotube structure is clamped between the smooth mounting surface and the at least one flange.

7. The method of claim 1, wherein the at least one flange extends from an outer lateral surface of the support body.

8. The method of claim 1, wherein the at least one flange extends radially and outwardly from an outer lateral surface of the support body before the step of securing.

9. The method of claim 8, wherein the at least one flange is positioned on an extended surface of the smooth mounting surface before the step of securing.

10. The method of claim 8, wherein the at least one flange is positioned in a plane below the smooth mounting surface before the step of securing.

11. The method of claim 8, wherein the at least one flange has a thickness smaller than or equal to that of the support body.

12. The method of claim 8, wherein the at least one flange comprises a plurality of flanges extending symmetrically and radially from the outer lateral surface of the support body before the step of securing, and the plurality of flanges are distorted towards to the smooth mounting surface of the support body in the step of securing.

13. The method of claim 1, wherein in the step of cutting, a laser beam irradiates the sheet-shaped carbon nanotube structure precursor around an outer edge of the support ring.

14. The method of claim 1, further comprising a step of treating the sheet-shaped carbon nanotube structure precursor or the sheet-shaped carbon nanotube structure with an organic solvent before or after the step of securing.

15. The method of claim 1, wherein the sheet-shaped carbon nanotube structure comprises at least one linear carbon nanotube structure or at least one carbon nanotube film.

16. A method for manufacturing a transmission electron microscope (TEM) micro-grid comprising:
    providing a support ring comprising a metal and a sheet-shaped carbon nanotube structure configured to load a sample observed in a TEM, wherein the support ring comprises a support body and a through hole defined in the support body, and the sheet-shaped carbon nanotube structure comprises a mounting portion and a working portion; and
    securing the sheet-shaped carbon nanotube structure on the support ring with the mounting portion installed on the support body and the working portion suspended over the through hole;
    wherein the support ring further comprises a smooth mounting surface and a plurality of flanges disposed on the support body, and in the step of securing, the mounting portion is held between the support body and the flanges by bending the flanges towards to the smooth mounting surface of the support body.

17. The method of claim 16, wherein the mounting portion extends around the working portion.

18. The method of claim 16, wherein in the step of securing, the sheet-shaped carbon nanotube structure is secured on a surface of the support body via adhesives or Van der Waals.

* * * * *